(12) United States Patent
Miyashita

(10) Patent No.: US 8,988,262 B2
(45) Date of Patent: Mar. 24, 2015

(54) DELAY CIRCUIT AND DIGITAL TO TIME CONVERTER

(71) Applicant: Kabushiki Kaisha Toshiba, Tokyo (JP)

(72) Inventor: Daisuke Miyashita, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 14/191,297

(22) Filed: Feb. 26, 2014

(65) Prior Publication Data

US 2015/0035690 A1 Feb. 5, 2015

(30) Foreign Application Priority Data

Aug. 1, 2013 (JP) ................. 2013-160418

(51) Int. Cl.
*H03M 1/82* (2006.01)
*H03K 5/13* (2014.01)

(52) U.S. Cl.
CPC *H03K 5/133* (2013.01); *H03M 1/82* (2013.01)
USPC .......................................... 341/152; 341/166

(58) Field of Classification Search
CPC ........... H03M 1/82; H03M 1/64; H03M 1/50; G06F 10/005; H03K 5/133
USPC ................................................. 341/152, 166
See application file for complete search history.

(56) References Cited

U.S. PATENT DOCUMENTS

| | | | |
|---|---|---|---|
| 7,221,214 B2 | 5/2007 | Santou | |
| 8,044,696 B2 * | 10/2011 | Kim et al. | 327/261 |
| 8,462,840 B2 * | 6/2013 | Chen et al. | 375/239 |
| 8,878,715 B2 | 11/2014 | Haider et al. | |
| 2007/0222493 A1 * | 9/2007 | Afentakis et al. | 327/276 |
| 2011/0310684 A1 | 12/2011 | Yamagami | |
| 2013/0265829 A1 | 10/2013 | Suzuki | |
| 2014/0055296 A1 | 2/2014 | Miyashita | |

FOREIGN PATENT DOCUMENTS

| | | | |
|---|---|---|---|
| JP | 2004-242119 A | 8/2004 |
| JP | 2004-242199 A | 8/2004 |
| JP | 2005353677 A | 12/2005 |
| JP | 2010206054 A | 9/2010 |
| JP | 2012-070159 A | 4/2012 |
| JP | 2013200932 A | 10/2013 |
| JP | 2014045268 A | 3/2014 |

* cited by examiner

*Primary Examiner* — Khai M Nguyen
(74) *Attorney, Agent, or Firm* — Patterson & Sheridan, LLP

(57) ABSTRACT

A delay circuit includes a first inverter in which a delay time of rising is larger than a delay time of falling, and a second inverter which is connected in series with the first inverter and in which a delay time of falling is larger than a delay time of rising. Transistors for each of the first and second inverters are connected in series between a power supply terminal and a ground terminal.

20 Claims, 7 Drawing Sheets

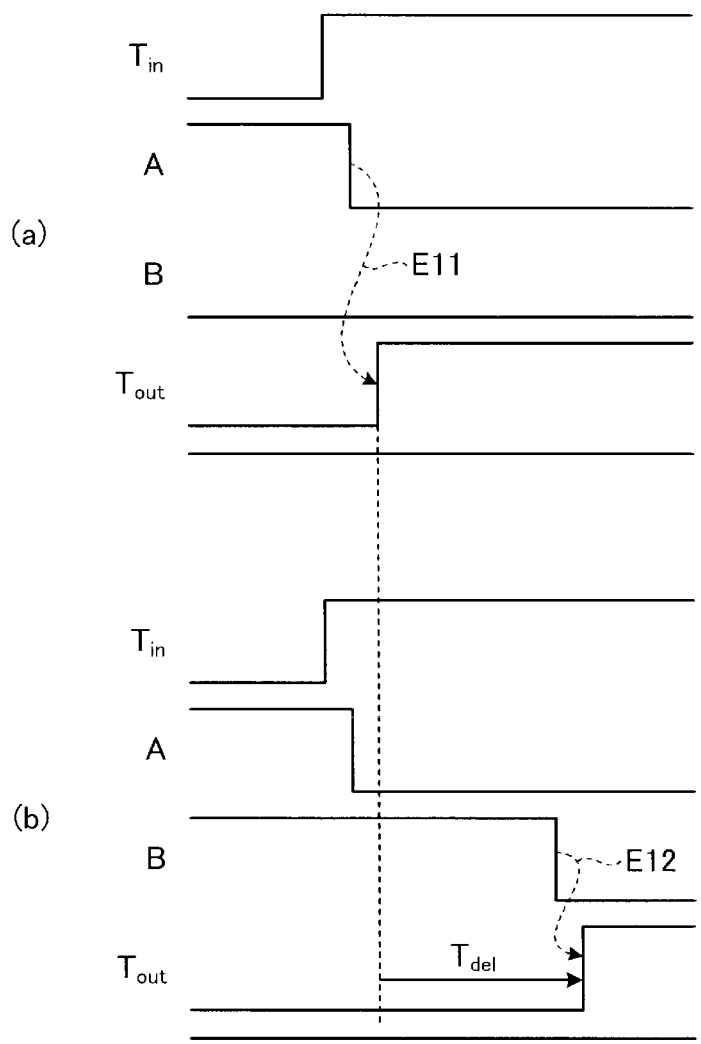

DELAY CIRCUIT AND DIGITAL TO TIME CONVERTER

CROSS-REFERENCE TO RELATED APPLICATION

This application is based upon and claims the benefit of priority from Japanese Patent Application No. 2013-160418, filed Aug. 1, 2013, the entire contents of which are incorporated herein by reference.

FIELD

Embodiments described herein relate generally to a delay circuit and a digital to time converter.

BACKGROUND

Inverters are used as a delay circuit for delaying a signal. By increasing the number of stages of inverters, the signal delay time can be increased.

DESCRIPTION OF THE DRAWINGS

FIG. 5(a) shows the waveforms when a digital input of the digital to time converter of FIG. 4A is at a low level, and FIG. 5(b) shows the waveforms when the digital input of the digital to time converter of FIG. 4A is at a high level.

DETAILED DESCRIPTION

Embodiments provide a delay circuit and a digital to time converter that achieves a reduction in layout area.

In general, according to one embodiment, a delay circuit includes a first inverter and a second inverter. In the first inverter, a delay time of rising is larger than a delay time of falling. The second inverter is connected in series with the first inverter, and a delay time of falling is larger than a delay time of rising in the second inverter. Transistors for each of the first and second inverters are connected in series between a power supply terminal and a ground terminal.

Hereinafter, delay circuits according to embodiments will be described in detail with reference to the accompanying drawings. However, the exemplary embodiment is not limited to the embodiments.

First Embodiment

Figure 1:
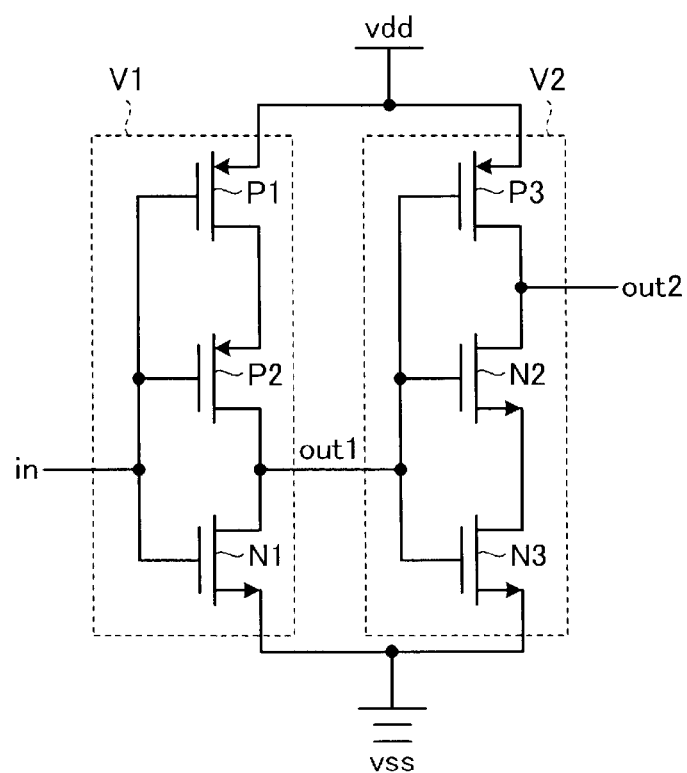
FIG. 1 is a circuit diagram illustrating a configuration of a delay circuit according to an embodiment.

FIG. 1 is a circuit diagram illustrating a configuration of a delay circuit according to an embodiment.

In FIG. 1, the delay circuit includes inverters V1 and V2 which are connected in series with each other. In a case of the inverter V1, a delay time of rising is larger than a delay time of falling. In a case of the inverter V2, a delay time of falling is larger than a delay time of rising. Transistors for each of the inverters V1 and V2 are connected in a single line.

That is, the inverter V1 includes P-type transistors P1 and P2 and an N-type transistor N1, and the inverter V2 includes a P-type transistor P3 and N-type transistors N2 and N3. The P-type transistors P1 and P2 and the N-type transistor N1 are connected in series, and the gates of the P-type transistors P1 and P2 and the N-type transistor N1 are commonly connected. The P-type transistor P3 and the N-type transistors N2 and N3 are connected in series, and the gates of the P-type transistor P3 and the N-type transistors N2 and N3 are commonly connected. The sources of the P-type transistors P1 and P3 are connected to a first potential vdd (for example, a power supply potential), and the sources of the N-type transistors N1 and N3 are connected to a second potential vss (for example, a ground potential). The first potential vdd can be set to be higher than the second potential vss.

Also, the gate widths of the P-type transistors P1 to P3 and the N-type transistors N1 to N3 can be set to be the same. Also, the delay circuit can be used as a primitive cell.

To the gates of the P-type transistors P1 and P2 and the N-type transistor N1, an input signal "in" is input, and from the drain of the P-type transistor P2, an output signal out1 is output. To the gates of the P-type transistor P3 and the N-type transistors N2 and N3, the output signal out1 is input, and from the drain of the N-type transistor N2, an output signal out2 is output.

Figure 2:
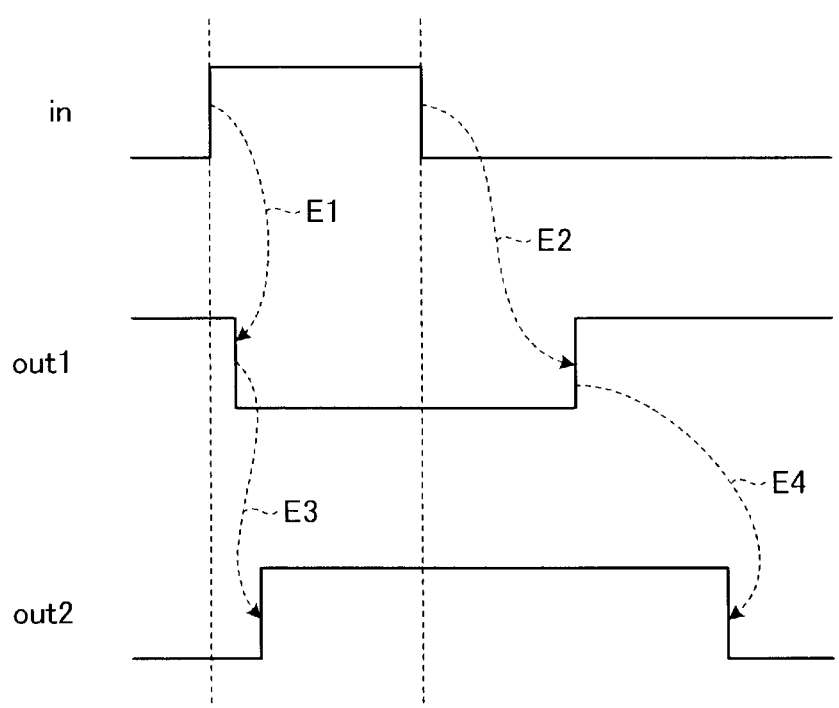
FIG. 2 is a timing chart illustrating the input and output waveforms of the delay circuit of FIG. 1.

FIG. 2 is a timing chart illustrating the input and output waveforms of the delay circuit of FIG. 1.

In FIG. 2, if the input signal "in" rises, the P-type transistors P1 and P2 are turned off, and the N-type transistor N1 is turned on. Therefore, the output of the inverter V1 is pulled down such that the output signal out1 falls (see a reference symbol "E1"). If the output signal out1 falls, the P-type transistor P3 is turned on and the N-type transistors N2 and N3 are turned off. Therefore, the output of the inverter V2 is pulled up such that the output signal out2 rises (see a reference symbol "E3").

Subsequently, if the input signal "in" falls, the P-type transistors P1 and P2 are turned on and the N-type transistor N1 is turned off. Therefore, the output of the inverter V1 is pulled up such that the output signal out1 rises (see a reference symbol "E2"). At this time, since P-type transistors P1 and P2 are connected in series, the on-resistance of the P-type transistors P1 and P2 becomes larger than the on-resistance of the N-type transistor N1. Therefore, in the inverter V1, a driving force at the time of pulling up becomes smaller than that at the time of pulling down, and a delay time of rising of the output signal out1 becomes larger than a delay time of falling of the output signal out1.

If the output signal out1 rises, the P-type transistor P3 is turned off, and the N-type transistors N2 and N3 are turned on. Therefore, the output of the inverter V2 is pulled down, such that the output signal out2 falls (see a reference symbol "E4"). At this time, since the N-type transistors N2 and N3 are connected in series, the on-resistance of the N-type transistors N2 and N3 becomes larger than the on-resistance of the P-type transistor P3. Therefore, in the inverter V2, a driving force at the time of pulling down becomes smaller than that at the time of pulling up, and a delay time of falling of the output signal out2 becomes larger than a delay time of rising of the output signal out2.

Therefore, in the delay circuit of FIG. 1, it is possible to make the delay time of falling larger than the delay time of rising. Here, in order to increase a delay time, it is necessary to increase the number of transistors to be connected in series in the inverter V1 or V2. Therefore, it becomes possible to suppress an increase in a layout area, as compared to a method of increasing both of a delay time of rising and a delay time of falling.

For example, the delay time of rising of the delay circuit of FIG. 1 is set by the P-type transistors P1 and P2 and the N-type transistors N2 and N3. For this reason, in order to implement the same delay time as the delay time of rising of the delay circuit of FIG. 1 by inverters in each of which the driving force of a P-type transistor and the driving force of an N-type transistor are the same, such as inverters of the related art, four stages of inverters are necessary, and thus a total of 8 transistors is necessary. Therefore, as compared to the related art case using four stages of inverters to implement the delay time of rising of the delay circuit of FIG. 1, it is possible to reduce the layout area to ¾, and it is also possible to reduce power consumption to ¾.

Figure 3:
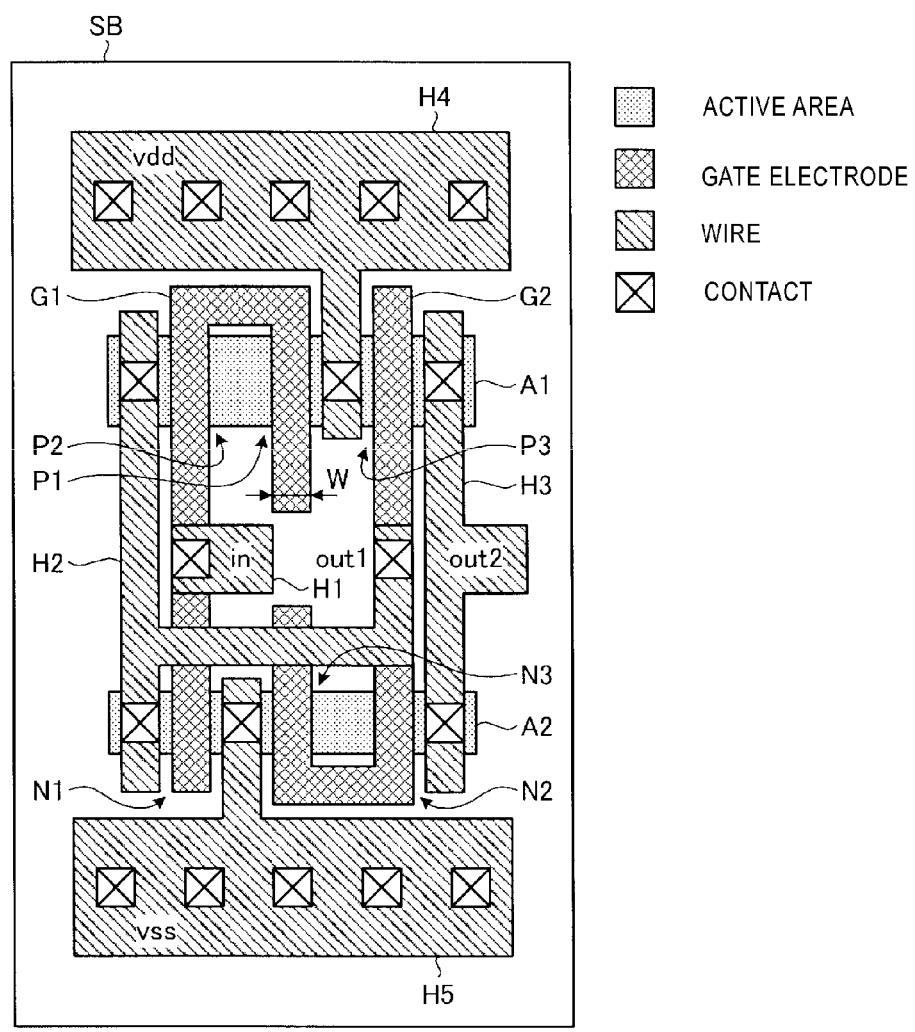
FIG. 3 is a plan view illustrating an example of the layout configuration of the delay circuit of FIG. 1.

FIG. 3 is a plan view illustrating an example of the layout configuration of the delay circuit of FIG. 1.

In FIG. 3, in a semiconductor substrate SB, active areas A1 and A2 are formed. On the active areas A1 and A2, gate electrodes G1 and G2 are formed. Here, the gate electrode G1 is disposed to intersect with the active area A1 two times, and intersect with the active area A2 one time. The gate electrode G2 is disposed to intersect with the active area A1 one time and intersect with the active area A2 two times. Also, the active areas A1 and A2 can constitute the source layers, drain layers, and channel layers of the transistors. Further, it is possible to set the gate widths W of the gate electrodes G1 and G2 to be the same on the active areas A1 and A2.

The active area A1 and the gate electrode G1 can constitute the P-type transistors P1 and P2, and the active area A1 and the gate electrode G2 can constitute the P-type transistor P3, and the active area A2 and the gate electrode G1 can constitute the N-type transistor N1, and the active area A2 and the gate electrode G2 can constitute the N-type transistors N2 and N3.

The source layers of the P-type transistors P1 and P3 are connected to the first potential vdd through a wire H4. The source layers of the N-type transistors N1 and N3 are connected to the second potential vss through a wire H5. The gate electrode G1 is connected to a wire H1. The drain layer of the P-type transistor P2 and the drain layer of the N-type transistor N1 are connected to the gate electrode G2 through a wire H2. The drain layer of the P-type transistor P3 and the drain layer of the N-type transistor N2 are connected to a wire H3.

Here, if the gate widths W of the gate electrodes G1 and G2 are set to be the same, it is possible to reduce variations of the characteristics of the P-type transistors P1 to P3 and the N-type transistors N1 to N3, and it is possible to improve the accuracy of the delay times of rising and falling.

Also, in the example of FIG. 1, a method of composing the delay circuit of the inverters V1 and V2 connected in two stages has been described. However, the delay circuit may be composed of inverters connected in three or more stages. Further, in the example of FIG. 1, a method of connecting the inverter V2 at the next stage of the inverter V1 in order to make the delay time of falling of the input signal "in" larger than the delay time of rising of the input signal "in" has been described. However, in order to make the delay time of rising of the input signal "in" larger than the delay time of falling of the input signal "in", the inverter V1 may be connected at the next stage of the inverter V2.

Furthermore, in the example of FIG. 1, a method of providing two P-type transistors P1 and P2, connected in series, and one N-type transistor N1 in the inverter V1 has been described. However, the first-stage inverter may be constituted by M-number of first P-type transistors connected in series and N-number of first N-type transistors connected in series (wherein M is an integer of 2 or greater and N is an integer smaller than N).

Moreover, in the example of FIG. 1, a method of providing one P-type transistor P3 and two N-type transistors N2 and N3, connected in series, in the inverter V2 has been described. However, the second-stage inverter may be constituted by P-number of second P-type transistors connected in series and Q-number of second N-type transistors connected in series (wherein P is a positive integer and Q is an integer larger than P).

Second Embodiment

Figure 4A:
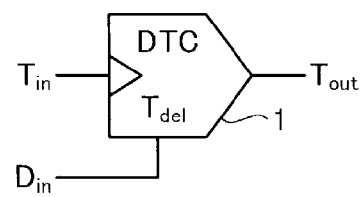
FIG. 4A is a block diagram illustrating a configuration of a digital to time converter according to an embodiment.
Figure 4B:
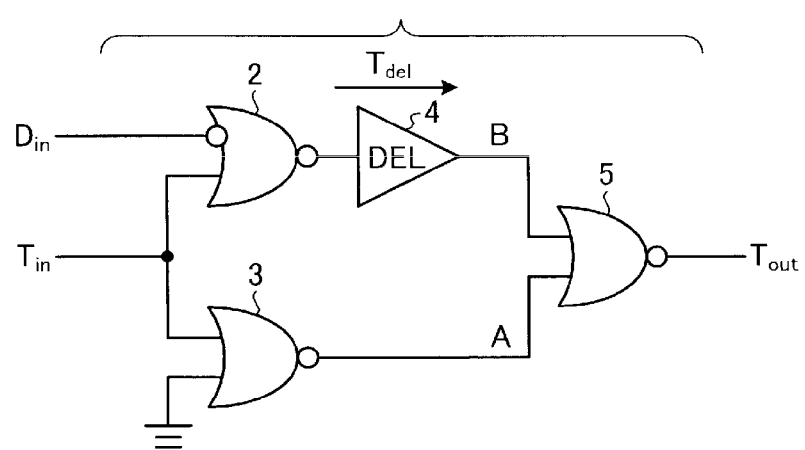
FIG. 4B is a circuit diagram illustrating an example configuration of the digital to time converter of FIG. 4A.

FIG. 4A is a block diagram illustrating a configuration of a digital to time converter according to an embodiment, and FIG. 4B is a circuit diagram illustrating an example configuration of the digital to time converter of FIG. 4A.

As shown in FIGS. 4A and 4B, a digital to time converter (DTC) 1 includes NOR circuits 2, 3, and 5, and a delay circuit 4. Also, the delay circuit 4 can be configured such that the delay time of rising of an output signal is larger than the delay time of falling of the output signal, and can use, for example, the configuration of FIG. 1. The delay time of falling of the output signal of the delay circuit 4 can be set to $T_{del}$.

Further, to a first input terminal of the NOR circuit 2, the inverted signal of a digital input $D_{in}$ is input, and to a second input terminal of the NOR circuit 2, an input signal $T_{in}$ is input. To a first input terminal of the NOR circuit 3, the input signal $T_{in}$ is input, and to a second input terminal of the NOR circuit 3, a ground potential is input. An output terminal of the NOR circuit 2 is connected to a first input terminal of the NOR circuit 5 through the delay circuit 4, and an output terminal of the NOR circuit 3 is connected to a second input terminal of the NOR circuit 5.

FIG. 5(a) shows the waveforms when a digital input of the digital to time converter of FIG. 4A is at a low level, and FIG. 5(b) shows the waveforms when the digital input of the digital to time converter of FIG. 4A is at a high level.

In FIG. 5(a), in a case where the digital input $D_{in}$ is at a low level, the input signal $T_{in}$ is interrupted by the NOR circuit 2, and thus the input signal $T_{in}$ is not input to the delay circuit 4. Therefore, even if the input signal $T_{in}$ rises, the output of the delay circuit 4 is maintained at a low level. Meanwhile, if the input signal $T_{in}$ rises, an output A of the NOR circuit 3 falls, whereby an output Tout of the NOR circuit 5 rises (see a reference symbol "E11").

As a result, in the case where the digital input $D_{in}$ is at the low level, the input signal $T_{in}$ bypasses the delay circuit 4 and is output from the digital to time converter 1.

Meanwhile, in a case where the digital input $D_{in}$ is at a high level, the input signal $T_{in}$ is interrupted by the NOR circuit 3, and the input signal $T_{in}$ is input to the delay circuit 4 through the NOR circuit 2. Therefore, as shown in FIG. (b) of 5, if the input signal $T_{in}$ rises, after an output B of the delay circuit 4 falls late by the delay time $T_{del}$ of the delay circuit 4, the output Tout of the NOR circuit 5 rises (see a reference symbol "E12").

As a result, in the case where the digital input $D_{in}$ is at the high level, the input signal $T_{in}$ is output from the digital to time converter 1 through the delay circuit 4 later by the delay time $T_{del}$ as compared to the case where the digital input $D_{in}$ is at the low level. Therefore, it is possible to shift the timing of the output Tout of the digital to time converter 1 according to the digital input Din, and it is possible to convert a 1-bit digital signal into a time signal. Here, if the configuration of FIG. 1 is used as the delay circuit 4, it is possible to reduce the circuit scale of the digital to time converter 1.

Third Embodiment

Figure 6:
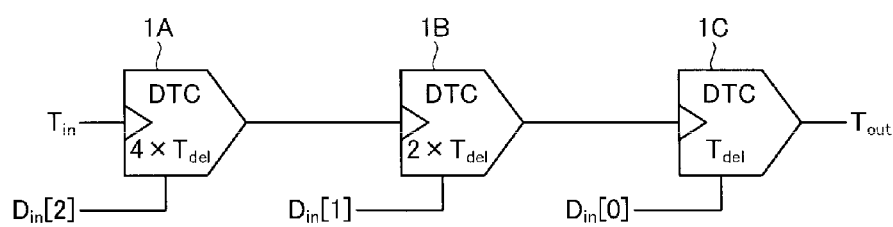
FIG. 6 is a block diagram illustrating a configuration of a digital to time converter according to another embodiment.
Figure 7:
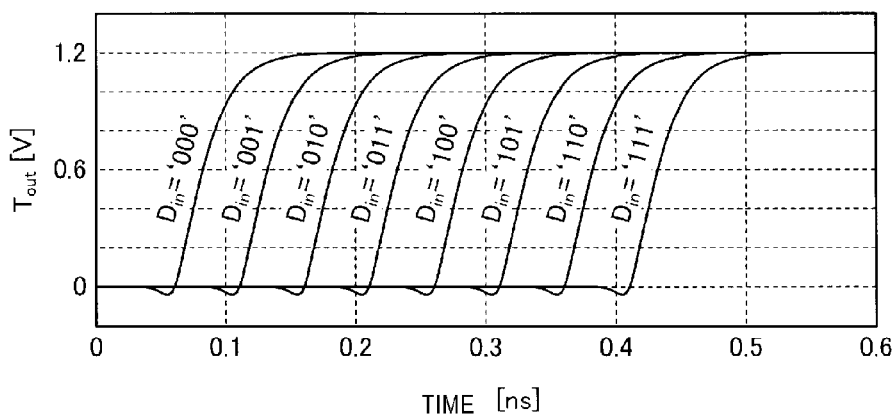
FIG. 7 is a view illustrating output waveforms according to digital inputs of the digital to time converter of FIG. 6.

FIG. 6 is a block diagram illustrating a configuration of a digital to time converter according to another embodiment, and FIG. 7 is a view illustrating output waveforms according to digital inputs of the digital to time converter of FIG. 6. Also, in the example of FIG. 6, a 3-bit digital to time converter is shown.

In FIG. 6, the 3-bit digital to time converter includes 1-bit digital to time converters 1A to 1C which are sequentially connected in series. Also, as each of the 1-bit digital to time converters 1A to 1C, the same configuration as that of FIG. 4A can be used.

Also, it is possible to set the delay time of the 1-bit digital to time converter 1C to $T_{del}$, and set the delay time of the 1-bit digital to time converter 1B to $2 \times T_{del}$, and set the delay time of the 1-bit digital to time converter 1A to $4 \times T_{del}$ Also, in a case of changing the delay time of each of the 1-bit digital to time converters 1A to 1C, the number of stages of inverters may be changed, or the number of transistors to be connected in series so as to constitute each inverter may be changed.

Further, to the 1-bit digital to time converter 1A, a most significant bit Din[2] of the digital input $D_{in}$ is input, and to the 1-bit digital to time converter 1B, a second-most significant bit Din[1] of the digital input $D_{in}$ is input, and to the 1-bit digital to time converter 1C, a least significant bit Din[0] of the digital input $D_{in}$ is input.

At this time, in a case where the most significant bit Din[2] of the digital input $D_{in}$ is at a high level, if the input signal $T_{in}$ rises, the delay of $4 \times T_{del}$ is given to the input signal $T_{in}$ by the 1-bit digital to time converter 1A. In a case where the second-most significant bit Din[1] of the digital input $D_{in}$ is at a high level, if the input signal $T_{in}$ rises, the delay of $2 \times T_{del}$ is given to the output of the 1-bit digital to time converter 1A by the 1-bit digital to time converter 1B. In a case where the least significant bit Din[0] of the digital input $D_{in}$ is at a high level, if the input signal $T_{in}$ rises, the delay of $T_{del}$ is given to the output of the 1-bit digital to time converter 1B by the 1-bit digital to time converter 1C. Therefore, as shown in FIG. 7, it is possible to shift the timing of the output Tout of the 3-bit digital to time converter according to the digital input Din, and it is possible to convert a 3-bit digital signal into a time signal. Here, if the configuration of FIG. 1 is used as each delay circuit, it is possible to reduce the circuit scale of the 3-bit digital to time converter. Also, it is possible to transmit a signal corresponding to 3 bits by one line, and thus it is possible to reduce the number of lines necessary to transmit a digital signal.

Also, in the example of FIG. 6, a case of using the delay circuit 4 to configure the 3-bit digital to time converter is shown. However, the delay circuit 4 can be used to constitute a K-bit digital to time converter (wherein K is an integer of 2 or greater).

Figure 8:
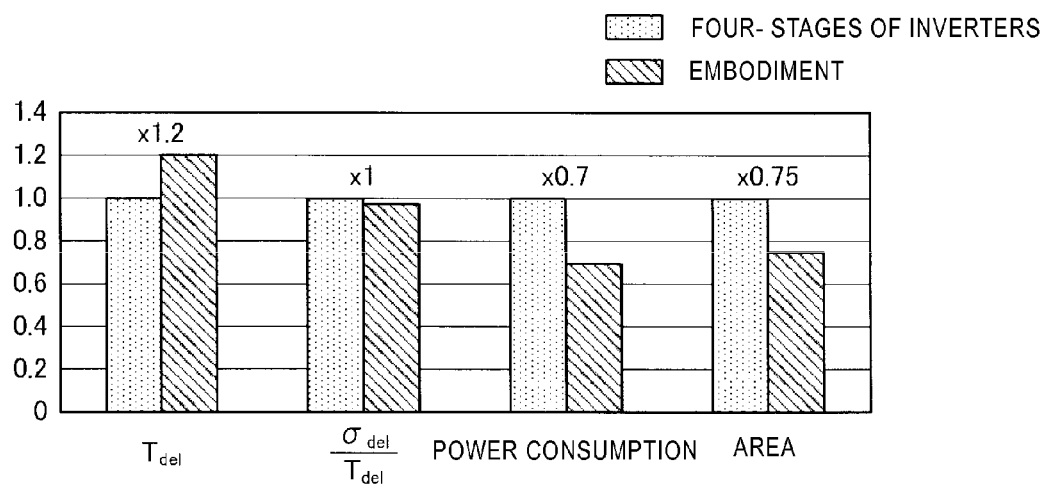
FIG. 8 is a view illustrating characteristics of a delay circuit of FIG. 4B as compared to four stages of inverters.

FIG. 8 is a view illustrating characteristics of the delay circuit of FIG. 4B as compared to four stages of inverters.

As shown in FIG. 8, as compared to four stages of inverters, the delay time $T_{del}$, dispersion $\sigma_{del}$ per delay time $T_{del}$, power consumption, and layout area of the delay circuit 4 of FIG. 4B are 1.2 times, 1 time, 0.7 times, and 0.75 times, respectively.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A delay circuit comprising:
   a first inverter in which a delay time of rising is larger than a delay time of falling; and
   a second inverter which is connected in series with the first inverter, and in which a delay time of falling is larger than a delay time of rising,
   wherein transistors for each of the first inverter and the second inverter are connected in series between a first power terminal and a second power terminal.

2. The delay circuit according to claim 1, wherein the first power terminal is connected to a power supply and the second power terminal is connected to ground.

3. The delay circuit according to claim 2, wherein an output signal of the first inverter is supplied to the second inverter as an input signal.

4. The delay circuit according to claim 1, wherein the transistors for the first inverter are laid out on a semiconductor substrate in a single line and the transistors for the second inverter are laid out on the semiconductor substrate in a single line.

5. The delay circuit according to claim 4, wherein gate widths of the transistors for the first and second inverters are the same.

6. The delay circuit according to claim 1, wherein
   the first inverter includes:
      a first P-type transistor; and
      a first N-type transistor which is connected in series with the first P-type transistor, and whose driving force is smaller than a driving force of the first P-type transistor; and
   the second inverter includes;
      a second P-type transistor; and
      a second N-type transistor which is connected in series with the second P-type transistor, and whose driving force is larger than a driving force of the second P-type transistor.

7. The delay circuit according to claim 1, wherein
   the transistors of the first inverter include first and second P-type transistors connected in series with a first N-type transistor between the first and second power terminals; and
   the transistors of the second inverter include a third P-type transistor connected in series with second and third N-type transistors between the first and second power terminals.

8. The delay circuit according to claim 7, wherein gates of the transistors of the first inverter are commonly connected to an input terminal of the delay circuit and a drain of the third P-type transistor is connected to an output terminal of the delay circuit.

9. The delay circuit according to claim 8, wherein gates of the transistors of the second inverter are commonly connected to a drain of the second P-type transistor.

10. A delay circuit comprising:
- a first inverter including m-number of first P-type transistors and n-number of first N-type transistors, that are connected in series between a first power terminal and a second power terminal; and
- a second inverter including p-number of second P-type transistors and q-number of second N-type transistors, that are connected in series between the first power terminal and the second power terminal,
- wherein m is 2 or more and n is less than m, and p is one or more and q is greater than p.

11. The delay circuit according to claim 10, wherein gate widths of the first P-type and first N-type transistors are the same, and gate widths of the second P-type and second N-type transistors are the same.

12. The delay circuit according to claim 10, wherein a delay time of falling is larger than a delay time of rising in the first inverter and a delay time of rising is larger than a delay time of falling in the second inverter.

13. The delay circuit according to claim 10, wherein an output signal of the first inverter is supplied to the second inverter as an input signal.

14. The delay circuit according to claim 10, wherein gates of the first P-type and first N-type transistors are commonly connected to an input terminal of the delay circuit and a drain of one of the second P-type transistors is connected to an output terminal of the delay circuit.

15. The delay circuit according to claim 14, wherein gates of the second P-type and second N-type transistors are commonly connected to a drain of one of the first P-type transistors.

16. A digital to time converter comprising:
- a delay circuit including a first inverter in which a delay time of rising is larger than a delay time of falling and a second inverter which is connected in series with the first inverter, and in which a delay time of falling is larger than a delay time of rising; and
- a logic circuit configured to cause an input signal of the digital to time converter to be passed through the delay circuit when a digital input is in a first state, and cause the input signal to bypass the delay circuit when the digital input is in a second state.

17. The digital to time converter according to claim 16, wherein
- the first inverter includes m-number of first P-type transistors and n-number of first N-type transistors, that are connected in series between a first power terminal and a second power terminal, where m is 2 or more and n is less than m; and
- the second inverter includes p-number of second P-type transistors and q-number of second N-type transistors, that are connected in series between a first power terminal and a second power terminal, where p is one or more and q is greater than p.

18. The digital to time converter according to claim 17, wherein gate widths of the first P-type and first N-type transistors are the same, and gate widths of the second P-type and second N-type transistors are the same.

19. The digital to time converter according to claim 16, wherein the logic circuit includes:
- a first NOR circuit to which the digital input is supplied as a first input and the input signal is supplied as a second input and whose output is connected to an input of the delay circuit;
- a second NOR circuit to which the input signal is supplied as a first input and a ground voltage is supplied as a second input; and
- a third NOR circuit to which an output of the delay circuit is supplied as a first input and an output of the second NOR circuit is supplied as a second input and whose output is supplied as an output of the digital to time converter.

20. The digital to time converter according to claim 16, further comprising:
- a second delay circuit; and
- a second logic circuit to which an output of the first logic circuit is supplied as an input signal, the second logic circuit being configured to cause the input signal to be passed through or bypass the second delay circuit.

\* \* \* \* \*